United States Patent
Chen et al.

(10) Patent No.: US 11,049,731 B2
(45) Date of Patent: Jun. 29, 2021

(54) METHODS FOR FILM MODIFICATION

(71) Applicant: Applied Materials, Inc., Santa Clara, CA (US)

(72) Inventors: Erica Chen, Cupertino, CA (US); Chentsau Chris Ying, Cupertino, CA (US); Bhargav S. Citla, Fremont, CA (US); Jethro Tannos, San Jose, CA (US); Matthew August Mattson, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/586,806

(22) Filed: Sep. 27, 2019

(65) Prior Publication Data

US 2020/0105541 A1  Apr. 2, 2020

Related U.S. Application Data

(60) Provisional application No. 62/737,883, filed on Sep. 27, 2018.

(51) Int. Cl.
*H01L 21/322* (2006.01)
*H01L 21/425* (2006.01)
*H01L 21/02* (2006.01)

(52) U.S. Cl.
CPC .... *H01L 21/3221* (2013.01); *H01L 21/02252* (2013.01); *H01L 21/02274* (2013.01); *H01L 21/425* (2013.01)

(58) Field of Classification Search
CPC .............. H01L 21/3221; H01L 21/425; H01L 21/02252; H01L 21/02274; H01L 21/0234; H01L 21/02332; H01L 21/02238
See application file for complete search history.

(56) References Cited

U.S. PATENT DOCUMENTS

| | | | |
|---|---|---|---|
| 2005/0003660 A1* | 1/2005 | Murakawa | H01L 21/3144 438/643 |
| 2005/0191803 A1* | 9/2005 | Matsuse | H01L 23/53238 438/202 |
| 2009/0104787 A1 | 4/2009 | Ohmi et al. | |
| 2010/0029093 A1 | 2/2010 | Shiozawa et al. | |
| 2010/0093185 A1* | 4/2010 | Kabe | H01L 21/02332 438/772 |

* cited by examiner

*Primary Examiner* — Caridad Everhart
(74) *Attorney, Agent, or Firm* — Servilla Whitney LLC

(57) ABSTRACT

A method of converting films is disclosed. A method of modifying films is also disclosed. Some methods advantageously convert films from a first elemental composition to a second elemental composition. Some methods advantageously modify film properties without modifying film composition.

20 Claims, 3 Drawing Sheets

METHODS FOR FILM MODIFICATION

CROSS-REFERENCE TO RELATED APPLICATIONS

This application claims priority to U.S. Provisional Application No. 62/737,883, filed Sep. 27, 2018, the entire disclosure of which is hereby incorporated by reference herein.

TECHNICAL FIELD

Embodiments of the present disclosure generally relate to methods for modifying or converting thin films. Some embodiments of the disclosure relate to methods for modifying or converting gap fill or spacer films.

BACKGROUND

Many semiconductor manufacturing schemes utilize gap fill and spacer materials to separate components. Forming these materials can be intensive, demanding harsh reactants, extreme processing conditions, multiple deposition and etch processes and/or specialized equipment.

Of particular concern for gap fill and spacer materials are the conformality of films, voids or seams which may be formed during deposition and poor film qualities. These properties are often inherent to the specific techniques used to deposit these specific materials. Conversely, other materials are able to be deposited which provide better conformality, fewer or smaller voids or seams and better film qualities.

Accordingly, there is a need for methods of modifying deposited films to provide better improved film qualities.

SUMMARY

One or more embodiments of the disclosure are directed to a method of converting a film. The method comprises providing a substrate with a film formed thereon. The film has a first elemental composition. The film is exposed to a microwave plasma formed from a reactant gas to form a converted film with a second elemental composition. The first elemental composition and the second elemental composition comprise at least one different element.

Additional embodiments of the disclosure are directed to methods of modifying a film. The methods comprise exposing a film to a microwave plasma formed from a plasma gas to form a modified film with at least one modified film property.

Further embodiments of the disclosure are directed to methods of converting a silicon oxide film. The methods comprise providing a substrate with a film formed thereon. The film consists essentially of silicon and oxygen. The film is exposed to a microwave plasma formed from a reactant gas comprising $H_2$ or $N_2$ to form a converted film consisting essentially of silicon or silicon and nitrogen. The microwave plasma has a frequency in a range of about 300 MHz to about 300 GHz, a power of less than or equal to about 50 kW, a radical density of greater than or equal to about $10^{12}$ radicals/$cm^3$ and an ion energy of less than or equal to about 50 eV.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a layer or partial layer has been deposited onto a substrate surface, the exposed surface of the newly deposited layer may also be described as the substrate surface.

Embodiments of the present disclosure relate to methods for modifying films. Some embodiments of the disclosure relate to methods for modifying the elemental composition of films. Some embodiments of the disclosure relate to methods for modifying the quality or properties of films.

Some embodiments of the disclosure advantageously provide methods for modifying films at lower temperatures. Some embodiments of the disclosure advantageously provide methods for modifying film compositions without modifying the conformality of deposited films. Some embodiments of the disclosure advantageously provide methods for modifying film compositions to enable better etch rate differences between deposited materials.

Figure 1:
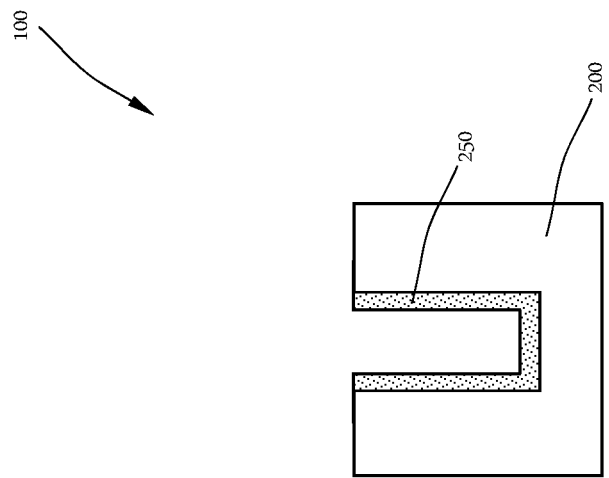
FIG. 1 illustrates a processing method on an exemplary substrate to convert a film according to one or more embodiment of the disclosure.
Figure 2:
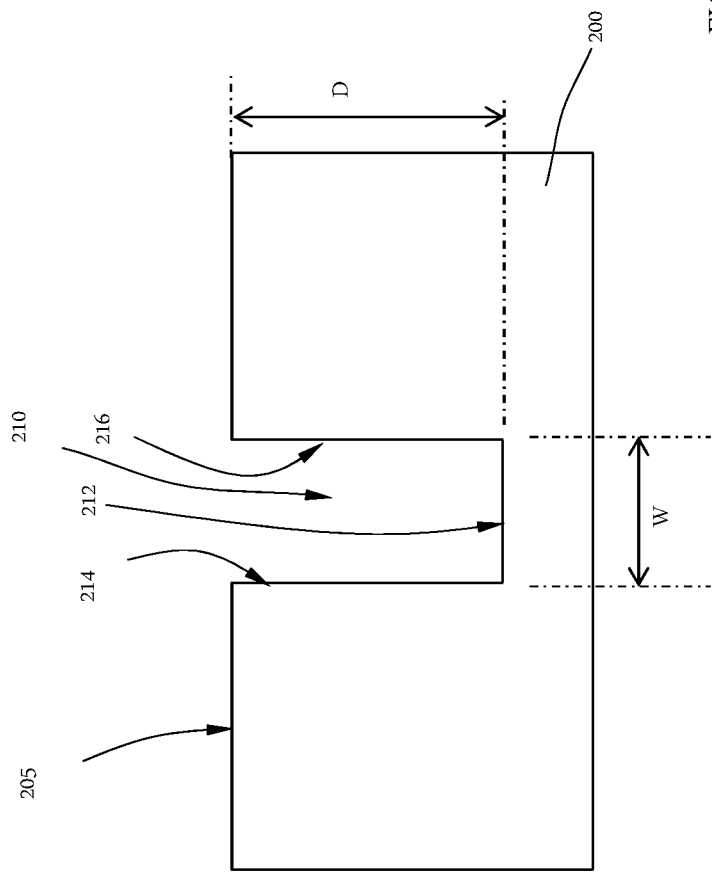
FIG. 2 illustrates a cross-sectional view of an exemplary substrate without a film according to one or more embodiment of the disclosure.

Referring to FIG. 1, a method 100 for converting a film is shown. The method 100 begins by providing a substrate 200 with a film 240 formed thereon. In some embodiments, as shown in FIG. 2, the substrate 200 has a substrate surface 205 with a feature 210 formed therein. The feature 210 forms an opening in the substrate surface 205. The feature 210 extends from the substrate surface 205 to a depth D to a bottom surface 212. As shown, the feature 210 has a first sidewall 214 and a second sidewall 216 that define a width W of the feature 210. The open area formed by the sidewalls and bottom may also be referred to as a gap. Referring again to FIG. 1, in some embodiments, the film 240 fills a portion of the feature 210.

The film 240 has a first elemental composition. As used herein, an elemental composition refers to the major elements present in the film. Elements present at concentrations of less than 5, 2, 1 or 0.5 atomic percent are not considered to be major elements. For the sake of simplicity, hydrogen is not considered when determining the elemental composition of a film.

At operation 102, the film 240 is exposed to a microwave plasma. The microwave plasma may also be referred to herein as simply "the plasma". The plasma is formed by igniting a reactant gas. Exposing the film 240 to the microwave plasma forms a converted film 250 with a second elemental composition. In some embodiments, the first elemental composition and the second elemental composition comprise at least one different element.

The reactant gas may be any suitable reactant gas. In some embodiments, the reactant gas comprises one or more of $H_2$, $O_2$, $N_2$ or $CO_2$. In some embodiments, the reactant gas comprises one or more of Ar or He. In some embodiments, the reactant gas comprises one or more of Ar, $H_2$, He, $O_2$, $N_2$ or $CO_2$. In some embodiments, the reactant gas additionally comprises a diluent or carrier gas. In some embodiments, the diluent or carrier gas is an inert gas.

In some embodiments, the plasma has a peak power of less than or equal to about 50 kW, less than or equal to about 40 kW, less than or equal to about 30 kW, less than or equal to about 25 kW, less than or equal to about 20 kW, less than or equal to about 17 kW, or less than or equal to 15 kW. In some embodiments, the plasma has a frequency in the range of about 300 MHz to about 300 GHz, or in the range of about 1 GHz to about 140 GHz, or in the range of about 1 GHz to about 100 GHz, or in the range of about 2 GHz to about 50 GHz, or in the range of about 3 GHz to about 30 GHz, or about 2.45 GHz or about 5.4 GHz.

Without being bound by theory, it is believed that the microwave plasma advantageously provides a plasma which has a high radical density but a low energy. It is believed that the higher radical density favors high chemical reactivity and that the low energy minimizes ion bombardment of the substrate and the associated damage and defects.

Without being bound by theory, it is believed that the design of the plasma antenna and chamber lid may affect coupling efficiency and plasma uniformity. In some embodiments, the plasma is formed using a planar slot antenna design. In some embodiments, the planar slot antenna design provides increased coupling efficiency and a more uniform plasma exposure.

In some embodiments, the plasma has a radical density (radicals/$cm^3$) of greater than or equal to about $10^{12}$, greater than or equal to about $10^{13}$, greater than or equal to about $10^{14}$, greater than or equal to about $10^{15}$, greater than or equal to about $10^{16}$, or greater than or equal to about $10^{17}$ radicals/$cm^3$. In some embodiments, the plasma has an energy of less than or equal to about 50 eV, less than or equal to about 40 eV, less than or equal to about 30 eV, less than or equal to about 25 eV, less than or equal to about 20 eV, less than or equal to about 15 eV, less than or equal to about 10 eV, less than or equal to about 8 eV, less than or equal to about 6 eV, less than or equal to about 5 eV, less than or equal to about 4 eV, less than or equal to about 2 eV, or less than or equal to about 1 eV. In some embodiments, the plasma has a plasma energy in the range of about 0.1 eV to about 50 eV, or in the range of about 0.5 eV to about 25 eV, or in the range of about 1 eV to about 10 eV.

The temperature of the substrate and/or the film may be controlled during exposure to the plasma. In some embodiments, the substrate surface is maintained at a temperature of less than or equal to about 800° C., less than or equal to about 750° C., less than or equal to about 700° C., less than or equal to about 650° C., less than or equal to about 600° C., less than or equal to about 500° C., less than or equal to about 400° C., less than or equal to about 300° C., less than or equal to about 200° C., less than or equal to about 100° C., less than or equal to about 50° C., or less than or equal to about 25° C. In some embodiments, the substrate surface is maintained at a temperature in a range of about room temperature (e.g., 25° C.) to about 800° C., about 300° C. to about 800° C., or about 600° C. to about 800° C.

In some embodiments, the first elemental composition comprises fewer elements than the second elemental composition. For example a film with a first elemental composition consisting essentially of silicon may be exposed to a plasma to produce a converted film with a second elemental composition comprising silicon and oxygen, nitrogen or carbon.

In some embodiments, the first elemental composition has the same number of elements as the second elemental composition, the first elemental composition being different than the second elemental composition. In some embodiments, the reactant gas comprises $N_2$, the first elemental composition consists of silicon and oxygen, and the second elemental composition consists of silicon and nitrogen. Stated differently, the plasma converts a silicon oxide film to a silicon nitride film.

In some embodiments, the second elemental composition comprises fewer elements than the first elemental composition. In some embodiments, the reactant gas comprises $H_2$, the first elemental composition consists of silicon and oxygen and the second elemental composition consists of silicon.

In some embodiments, as shown, all or substantially all of film 240 is converted to converted film 250. In some embodiments, not shown, an exterior portion of film 240 is converted to converted film 250 while an underlayer of film 240 remains present.

Without being bound by theory, the disclosed methods of converting films advantageously allows for the conversion of films with certain desired properties (e.g., conformality, gap fill without seam or void, etc.) to other films with other desired properties (e.g., etch resistance, density, refractive index, etc.). In this way, it is possible to achieve certain properties of the second film without having to deposit the second film and/or to achieve improved properties in the second film which may not be available if deposited directly. Additionally, the disclosed methods of modifying films advantageously allow for the modification of some film properties (e.g., etch resistance, density, refractive index, etc.) without changing other film properties (e.g., elemental composition, conformality, etc.).

In some embodiments, the first elemental composition and the second elemental composition comprise the same elements. In those embodiments when the elemental composition remains unchanged, the converted film may be referred to as a modified film and the reactant gas may be referred to as a plasma gas.

Figure 3:
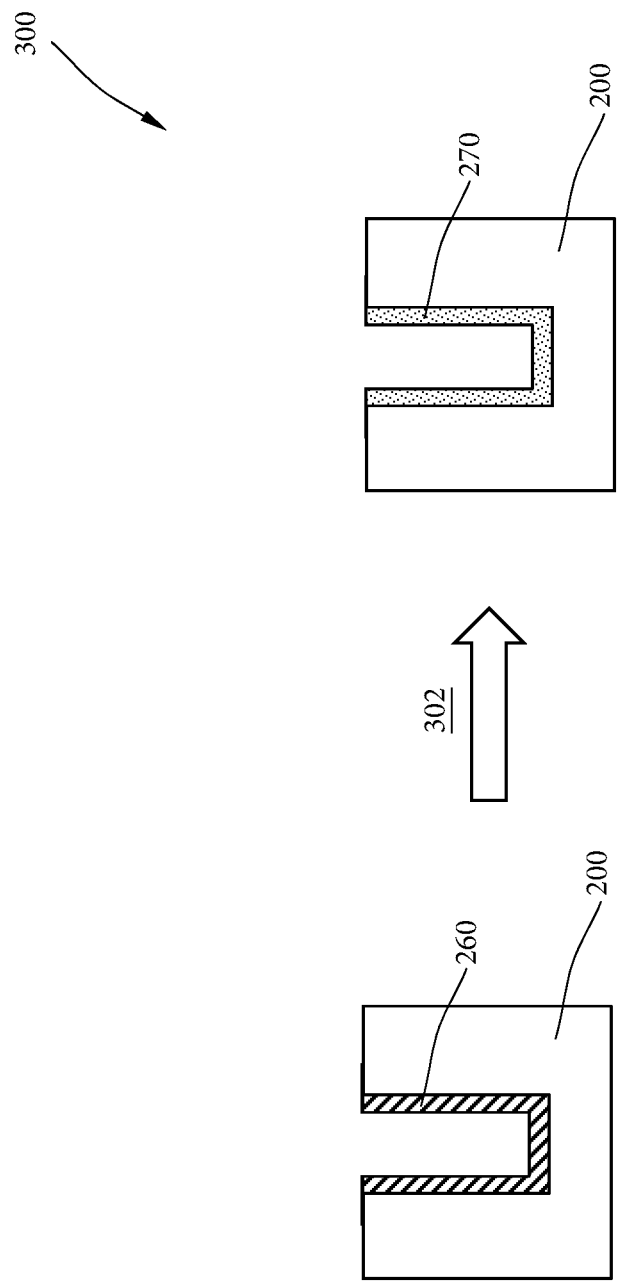
FIG. 3 illustrates a processing method on an exemplary substrate to modify a film according to one or more embodiment of the disclosure.

Referring to FIG. 3, a method 300 for modifying a film is shown. The method 300 begins by providing a substrate 200 with a film 260 formed thereon. In some embodiments, as shown in FIG. 2, the substrate 200 has a substrate surface 205 with a feature 210 formed therein. The feature 210 forms an opening in the substrate surface 205. The feature 210 extends from the substrate surface 205 to a depth D to a bottom surface 212. As shown, the feature 210 has a first sidewall 214 and a second sidewall 216 that define a width W of the feature 210. The open area formed by the sidewalls and bottom may also be referred to as a gap. Referring again to FIG. 3, in some embodiments, the film 260 fills a portion of the feature 210.

At operation 302, the film 260 is exposed to a microwave plasma. The microwave plasma may also be referred to herein as simply "the plasma". The plasma is formed by igniting a reactant gas. Exposing the film 260 to the microwave plasma forms a modified film 270 with at least one modified film property. In some embodiments, the modified film property comprises one or more of etch rate, density, or refractive index.

The reactant gas may be any suitable reactant gas. In some embodiments, the reactant gas comprises one or more of $H_2$, $O_2$, $N_2$ or $CO_2$. In some embodiments, the reactant gas comprises one or more of Ar or He. In some embodiments, the reactant gas comprises one or more of Ar, $H_2$, He, $O_2$, $N_2$ or $CO_2$. In some embodiments, the reactant gas additionally comprises a diluent or carrier gas. In some embodiments, the diluent or carrier gas is an inert gas.

In some embodiments, the plasma has a peak power of less than or equal to about 50 kW, less than or equal to about 40 kW, less than or equal to about 30 kW, less than or equal to about 25 kW, less than or equal to about 20 kW, less than or equal to about 17 kW, or less than or equal to about 15 kW. In some embodiments, the plasma has a frequency in the range of about 300 MHz to about 300 GHz, or in the range of about 1 GHz to about 140 GHz, or in the range of about 1 GHz to about 100 GHz, or in the range of about 2 GHz to about 50 GHz, or in the range of about 3 GHz to about 30 GHz, or about 2.45 GHz or about 5.4 GHz.

Without being bound by theory, it is believed that the microwave plasma advantageously provides a plasma which has a high radical density but a low energy. It is believed that the higher radical density favors high chemical reactivity and that the low energy minimizes ion bombardment of the substrate and the associated damage and defects.

Without being bound by theory, it is believed that the design of the plasma antenna and chamber lid may affect coupling efficiency and plasma uniformity. In some embodiments, the plasma is formed using a planar slot antenna design. In some embodiments, the planar slot antenna design provides increased coupling efficiency and a more uniform plasma exposure.

In some embodiments, the plasma has a radical density (radicals/cm$^3$) of greater than or equal to about $10^{12}$, greater than or equal to about $10^{13}$, greater than or equal to about $10^{14}$, greater than or equal to about $10^{15}$, greater than or equal to about $10^{16}$, or greater than or equal to about $10^{17}$ radicals/cm$^3$. In some embodiments, the plasma has an energy of less than or equal to about 50 eV, less than or equal to about 40 eV, less than or equal to about 30 eV, less than or equal to about 25 eV, less than or equal to about 20 eV, less than or equal to about 15 eV, less than or equal to about 10 eV, less than or equal to about 8 eV, less than or equal to about 6 eV, less than or equal to about 5 eV, less than or equal to about 4 eV, less than or equal to about 2 eV, or less than or equal to about 1 eV. In some embodiments, the plasma has a plasma energy in the range of about 0.1 eV to about 50 eV, or in the range of about 0.5 eV to about 25 eV, or in the range of about 1 eV to about 10 eV.

The temperature of the substrate and/or the film may be controlled during exposure to the plasma. In some embodiments, the substrate surface is maintained at a temperature of less than or equal to about 800° C., less than or equal to about 750° C., less than or equal to about 700° C., less than or equal to about 650° C., less than or equal to about 600° C., less than or equal to about 500° C., less than or equal to about 400° C., less than or equal to about 300° C., less than or equal to about 200° C., less than or equal to about 100° C., less than or equal to about 50° C., or less than or equal to about 25° C. In some embodiments, the substrate surface is maintained at a temperature in a range of about room temperature (e.g., 25° C.) to about 800° C., about 300° C. to about 800° C., or about 600° C. to about 800° C.

In some embodiments, as shown, all or substantially all of film 260 is converted to modified film 270. In some embodiments, not shown, an exterior portion of film 260 is converted to modified film 270 while an underlayer of film 260 remains present.

Without being bound by theory, the disclosed methods of modifying films advantageously allows for the modification of films with certain desired properties (e.g., conformality, gap fill without seam or void, etc.) to other films with other desired properties (e.g., etch resistance, density, refractive index, etc.). In this way, it is possible to achieve certain properties of the second film without having to deposit the second film and/or to achieve improved properties in the second film which may not be available if deposited directly. Additionally, the disclosed methods of modifying films advantageously allow for the modification of some film properties (e.g., etch resistance, density, refractive index, etc.) without changing other film properties (e.g., elemental composition, conformality, etc.).

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of converting a film, the method comprising:
exposing a film having a first elemental composition to a microwave plasma formed from a reactant gas to form a converted film with a second elemental composition, the first elemental composition and the second elemental composition comprising at least one different element, the microwave plasma has at least one of a peak power of less than or equal to about 50 kW, a radical density of greater than or equal to about $10^{12}$ radicals/cm$^3$, or an ion energy of less than or equal to about 50 eV.

2. The method of claim 1, wherein the substrate has a substrate surface with at least one feature formed therein and the film fills a portion of the at least one feature.

3. The method of claim 1, wherein the film comprises a spacer for logic applications.

4. The method of claim 1, wherein the microwave plasma has a frequency in a range of about 300 MHz to about 300 GHz.

5. The method of claim 1, wherein the microwave plasma has a peak power of less than or equal to about 50 kW.

6. The method of claim 1, wherein the microwave plasma has a radical density of greater than or equal to about $10^{12}$ radicals/cm$^3$.

7. The method of claim 1, wherein the microwave plasma has an ion energy of less than or equal to about 50 eV.

8. The method of claim 1, wherein the reactant gas comprises one or more of $H_2$, $O_2$, $N_2$ or $CO_2$.

9. The method of claim 1, wherein the substrate is maintained at a temperature of less than 800° C.

10. The method of claim 1, wherein the first elemental composition comprises fewer elements than the second elemental composition.

11. The method of claim 1, wherein the first elemental composition has the same number of elements as the second elemental composition, the first elemental composition being different than the second elemental composition.

12. The method of claim 11, wherein the reactant gas comprises $N_2$, the first elemental composition consists of silicon and oxygen, and the second elemental composition consists of silicon and nitrogen.

13. The method of claim 1, wherein the second elemental composition comprises fewer elements than the first elemental composition.

14. The method of claim 13, wherein the reactant gas comprises $H_2$, the first elemental composition consists of silicon and oxygen and the second elemental composition consists of silicon.

15. A method of modifying a film, the method comprising exposing a film to a microwave plasma formed from a plasma gas to form a modified film with at least one modified film property, wherein the microwave plasma has at least one of a power of less than or equal to about 50 kW, a radical density of greater than or equal to about $10^{12}$ radicals/cm$^3$, or an ion energy of less than or equal to about 50 eV.

16. The method of claim 15, wherein the microwave plasma has a frequency in a range of about 300 MHz to about 300 GHz.

17. The method of claim 15, wherein the plasma gas comprises one or more of Ar, He, $H_2$, $O_2$, $N_2$ or $CO_2$.

18. The method of claim 15, wherein the film is maintained at a temperature of less than or equal to 800° C.

19. A method of converting a silicon oxide film, the method comprising:
exposing a film consisting essentially of silicon and oxygen to a microwave plasma formed from a reactant gas comprising $H_2$ or $N_2$ to form a converted film consisting essentially of silicon or silicon and nitrogen, the microwave plasma having a frequency in a range of about 300 MHz to about 300 GHz, a power of less than or equal to about 50 kW, a radical density of greater than or equal to about $10^{12}$ radicals/cm$^3$ and an ion energy of less than or equal to about 50 eV.

20. The method of claim 15, wherein the film comprises a spacer for logic applications.

* * * * *